(12) United States Patent
Yang et al.

(10) Patent No.: US 6,724,464 B2
(45) Date of Patent: Apr. 20, 2004

(54) POSITION DETECTING METHOD AND UNIT, OPTICAL CHARACTERISTIC MEASURING METHOD AND UNIT, EXPOSURE APPARATUS, AND DEVICE MANUFACTURING METHOD

(75) Inventors: Juping Yang, Kawasakishi (JP); Toru Fujii, Tokyo (JP); Fuyuhiko Inoue, San Mateo, CA (US)

(73) Assignee: Nikon Corporation, Tokyo (JP)

( * ) Notice: Subject to any disclaimer, the term of this patent is extended or adjusted under 35 U.S.C. 154(b) by 0 days.

(21) Appl. No.: 10/025,917

(22) Filed: Dec. 26, 2001

(65) Prior Publication Data

US 2002/0118349 A1 Aug. 29, 2002

(30) Foreign Application Priority Data

Dec. 27, 2000 (JP) ........................................ 2000-399065

(51) Int. Cl.[7] ........................ G03B 27/52; G03B 27/42; G03B 27/54
(52) U.S. Cl. ........................ 355/55; 355/53; 355/67
(58) Field of Search .......................... 355/52, 53, 55, 355/67–71, 77; 356/399–401, 359; 250/548, 201.9; 430/30, 22

(56) References Cited

U.S. PATENT DOCUMENTS

| | | | |
|---|---|---|---|
| 4,326,800 A | 4/1982 | Fitts | ............... 356/152 |
| 4,490,039 A | 12/1984 | Bruckler et al. | |
| 4,932,781 A | 6/1990 | Kuwayama | |
| 5,233,174 A | 8/1993 | Zmek | |
| 5,493,391 A | 2/1996 | Neal et al. | |
| 5,539,718 A | 7/1996 | Hoshi et al. | ............... 369/100 |
| 5,610,897 A | 3/1997 | Yamamoto et al. | ......... 369/124 |
| 5,684,569 A * | 11/1997 | Sugaya et al. | ............... 355/71 |
| 5,760,879 A | 6/1998 | Shinonaga et al. | |
| 5,828,455 A | 10/1998 | Smith et al. | |
| 5,864,381 A | 1/1999 | Neal et al. | |
| 5,898,501 A * | 4/1999 | Suzuki et al. | ............... 356/359 |
| 5,912,731 A | 6/1999 | DeLong et al. | ............. 356/121 |
| 5,936,720 A | 8/1999 | Neal et al. | |
| 5,978,085 A | 11/1999 | Smith et al. | |
| 6,052,180 A | 4/2000 | Neal et al. | |
| 6,130,419 A | 10/2000 | Neal | |
| 6,184,974 B1 | 2/2001 | Neal et al. | |
| 6,245,470 B1 * | 6/2001 | Kamon | ........................ 430/30 |
| 6,278,514 B1 | 8/2001 | Ohsaki | |
| 6,360,012 B1 | 3/2002 | Kreuzer | ...................... 382/211 |
| 6,396,569 B2 * | 5/2002 | Zheng et al. | .................. 355/77 |

FOREIGN PATENT DOCUMENTS

EP    1 079 223    2/2001

OTHER PUBLICATIONS

W. Freitag, et al., Jr, pp. 8–12, "Wavefront Analysis of Photolithographic Lenses", Jan. 1991.

T. Noguchi, et al., Publ. Natl. Astron. Obs. Japan, vol. 1, pp. 49–55, "Active Optics Experiments. I. Shack–Hartman Wave–Front Analyzer to Measure F/5 Mirrors", 1989.

* cited by examiner

*Primary Examiner*—Henry Hung Nguyen
(74) *Attorney, Agent, or Firm*—Oblon, Spivak, McClelland, Maier & Neustadt, P.C.

(57) ABSTRACT

Correlation values between a plurality of templates prepared beforehand and a picture-element data distribution as a pick-up result of an image are calculated, and the position of a maximum template whose correlation value is the maximum of the calculated correlation values is obtained. Subsequently, a curved surface function is calculated which fits the distribution of calculated correlation-values in positions near the maximum template's position, and the position of the picked-up image is calculated based on the curved surface function. As a result, the number of templates prepared beforehand to achieve desired accuracy in detecting a position and the number of times of calculating correlation-values can be reduced, and the image position can be quickly and accurately detected.

13 Claims, 13 Drawing Sheets

POSITION DETECTING METHOD AND UNIT, OPTICAL CHARACTERISTIC MEASURING METHOD AND UNIT, EXPOSURE APPARATUS, AND DEVICE MANUFACTURING METHOD

BACKGROUND OF THE INVENTION

1. Field of the Invention

The present invention relates to a position detecting method and unit, an optical characteristic measuring method and unit, an exposure apparatus, and a device manufacturing method, and more specifically to a position detecting method and unit for detecting the position of an image formed by an optical system, an optical characteristic measuring method and unit for measuring an optical characteristic of an optical system to be examined using the position detecting method, an exposure apparatus comprising the optical characteristic measuring unit, and a device manufacturing method using the exposure apparatus.

2. Description of the Related Art

In a lithography process for manufacturing semiconductor devices, liquid crystal display devices, or the like, exposure apparatuses have been used which transfer a pattern (also referred to as a "reticle pattern" hereinafter) formed on a mask or reticle (generically referred to as a "reticle" hereinafter) onto a substrate, such as a wafer or glass plate (hereinafter, generically referred to as a "substrate" as needed), coated with a resist through a projection optical system. As such an exposure apparatus, a stationary-exposure-type projection exposure apparatus such as the so-called stepper, or a scanning-exposure-type projection exposure apparatus such as the so-called scanning stepper is mainly used.

Such an exposure apparatus needs to accurately project the pattern on a reticle onto a substrate with high resolving power. Therefore, the projection optical system is designed to have a good optical characteristic with various types of aberrations being reduced.

However, it is difficult to make a projection optical system completely as is planned in design, and various types of aberrations due to various factors remain in a projection optical system actually made. Therefore, the optical characteristic of the projection optical system actually made is not the same as planned in design.

Various technologies for measuring the optical characteristic, related to aberration, of the actually made projection optical system as an optical system to be examined have been suggested, and of those technologies a wave-front aberration measuring method is attracting attentions, which comprises (a) making a spherical wave produced by a pinhole incident on the optical system to be examined, (b) producing parallel rays of light from light that has passed through the optical system to be examined and forms a pinhole image and dividing the wave front thereof into a plurality of portions, (c) making each of the portions form a spot image, and (d) calculating wave-front aberration due to the optical system based on measured positions where the spot images are formed.

A wave-front aberration measuring unit using this method may comprise a micro-lens array, in which a plurality of micro lenses are arranged along a two-dimensional plane parallel to the ideal wave front of the parallel rays of light, as a wave-front dividing device for dividing the incident light and making each of the divided wave-front portions form a spot image. The wave-front aberration measuring unit picks up the spot images by a pick-up device such as CCD, calculates the center-of-gravity of light intensity of each spot-image using a center-of-gravity method or a position where correlation between light intensity distribution of each spot-image and a template is maximal using a correlation method, to detect the positions of the spot images, and calculates wave-front aberration based on deviations of the detected spot images' positions from positions planned in design.

The center-of-gravity method and correlation method are robust to noise and generally an excellent method. However, in the case of detecting the positions of spot-images by a small number of picture elements (e.g., a 5×5 matrix arrangement of effective picture elements) and with accuracy of much smaller than the dimension of the picture element (e.g., $\frac{1}{100}$ to $\frac{1}{1000}$ of the dimension of the picture element), they are not effective.

That is, the center-of-gravity method with a small number of picture elements cannot detect the positions of spot-images with desired accuracy in principle. Moreover, because the correlation method needs to calculate correlations with a very large number of templates (about 100×100 to 1000×1000), it cannot quickly detect positions.

Because of the demand for further improved exposure accuracy corresponding to increasingly high integration in recent years, in measuring wave-front aberration due to a projection optical system, the method of detecting the positions of spot-images by a small number of picture elements and with accuracy of much smaller than the dimension of the picture element is needed.

DISCLOSURE of INVENTION

This invention was made under such circumstances, and a first purpose of the present invention is to provide a position detecting method and unit which can quickly and accurately detect the positions of spot-images even by a small number of picture elements.

Moreover, a second purpose of the present invention is to provide an optical characteristic measuring method and unit which accurately detects the optical characteristic of an optical system to be examined.

Furthermore, a third purpose of the present invention is to provide an exposure apparatus that can accurately transfer a given pattern onto a substrate.

Moreover, a fourth purpose of the present invention is to provide a device manufacturing method which can manufacture highly integrated devices having a fine pattern thereon.

According to a first aspect of the present invention, there is provided a position detecting method with which to detect a position of a picked-up image, the position detecting method comprising preparing a plurality of templates with which correlation values of a picture-element data distribution, as a pick-up result of the image, are calculated and which correspond to same reference images of which center positions are spaced a predetermined distance apart; obtaining, by calculating correlation values between the picture-element data distribution and the plurality of templates, position of a maximum template whose correlation value is maximal; obtaining at least one of a curved line function and curved surface function which fit a distribution of correlation values of the correlation values calculated, the center of the distribution being present in the maximum template's position; and calculating position of the picked-up image based on the at least one function.

According to this, correlation values between a plurality of templates prepared beforehand and a picture-element data distribution as a pick-up result of an image are calculated, and the position of a maximum template whose correlation value is the maximum of the calculated correlation values is obtained, the maximum template's position being the center of a reference image in the template. At this point of time the position of the image is identified with accuracy of a predetermined distance which is adopted in generating the plurality of template. Subsequently, at least one of a curved line function and curved surface function is calculated which fits the distribution of calculated correlation-values in positions near the maximum template's position and which is a function of position, and the position of the picked-up image is calculated based on the at least one function. A position where the at least one function takes on, e.g., a local maximum near the maximum template's position is calculated as the position of the picked-up image. As a result, the position of the picked-up image can be detected with improved accuracy in comparison to the predetermined distance. Therefore, the number of templates prepared beforehand to achieve desired accuracy in detecting a position and the number of times of calculating correlation-values can be reduced, and the image position can be quickly and accurately detected.

In the position detecting method according to this invention, the picked-up image may be a spot image.

Moreover, in the position detecting method according to this invention, when a first number denoting the number of the correlation values to which the at least one function is fitted is larger than a second number denoting the number of parameters which define the at least one function, the second number of parameters may be determined using a statistical method to obtain the at least one function.

According to a second aspect of the present invention, there is provided a position detecting unit which detects a position of a picked-up image by a pick-up unit, the position detecting unit comprising a template-preparing unit connected to the pick-up unit, which prepares a plurality of templates with which correlation values of a picture-element data distribution, as a pick-up result of the image, are calculated and which correspond to same reference images of which center positions are spaced a predetermined distance apart; a correlation-computing unit connected to the template-preparing unit, which, by calculating correlation values between the picture-element data distribution and the plurality of templates, obtains position of a maximum template whose correlation value is maximal; and an image-position calculating unit connected to the correlation-computing unit, which obtains at least one of a curved line function and curved surface function which fit a distribution of correlation values of the correlation values calculated and each are a function of position, the center of the distribution being present in the maximum template's position, and calculates position of the picked-up image based on the at least one function.

According to this, a correlation-computing unit calculates correlation values between a plurality of templates prepared beforehand by a template-preparing unit and a picture-element data distribution as a pick-up result of an image, and obtains the position of a maximum template whose correlation value is the maximum of the calculated correlation values. And an image-position calculating unit obtains at least one of a curved line function and curved surface function which fit the distribution of calculated correlation-values in positions near the maximum template's position and calculates the position of the picked-up image based on the at least one function. That is, the position detecting unit according to this invention detects the position of an image by the position detecting method of this invention. Therefore, the image position can be quickly and accurately detected.

In the position detecting unit according to this invention, the picked-up image may be a spot image.

According to a third aspect of the present invention, there is provided an optical characteristic measuring method with which to measure an optical characteristic of an optical system to be examined, the optical characteristic measuring method comprising dividing a wave front of light which has passed through the optical system to be examined, to form a plurality of images; picking up the plurality of images; detecting positions of the plurality of images picked up in the picking-up using the position detecting method according to this invention; and calculating an optical characteristic of the optical system to be examined based on the detected positions of the images.

According to this, the positions of the plurality of images formed on the image plane are accurately detected using the position detecting method according to this invention. Based on the detected positions of the plurality of images, the optical characteristic of the optical system to be examined is calculated. Accordingly, the optical characteristic of the optical system can be very accurately measured.

In the optical characteristic measuring method according to this invention, the optical characteristic may be wave-front aberration.

According to a fourth aspect of the present invention, there is provided an optical characteristic measuring unit which measures an optical characteristic of an optical system to be examined, the optical characteristic measuring unit comprising a wave-front dividing device which is arranged on an optical path of light passing through the optical system to be examined, divides a wave front of the light passing through the optical system to be examined, and forms a plurality of images; a pick-up unit which is arranged a predetermined distance apart from the wave-front dividing device and picks up the plurality of images; a position detecting unit according to claim 4, which is connected to the pick-up unit and detects positions of the plurality of images picked up by the pick-up unit; and an optical characteristic calculating unit connected to the position detecting unit, which calculates an optical characteristic of the optical system to be examined based on the detected positions of the plurality of images.

According to this, a pick-up unit picks up a plurality of images that is formed through a wave-front dividing device. Subsequently, a position detecting unit using the position detecting method of this invention accurately detects the positions of the plurality of images from the pick-up result. And an optical characteristic calculating unit calculates the optical characteristic of the optical system to be examined based on the detected positions of the plurality of images. That is, the optical characteristic measuring unit of this invention measures the optical characteristic of the optical system to be examined using the optical characteristic measuring method of this invention, so that the optical characteristic of the optical system can be accurately measured.

In the optical characteristic measuring unit according to this invention, the wave-front dividing device may be a micro-lens array in which lens elements are arranged two-dimensionally.

Moreover, in the optical characteristic measuring unit according to this invention, the optical system to be examined may be a projection optical system that transfers a pattern formed on a mask onto a substrate.

According to a fifth aspect of the present invention, there is provided an exposure apparatus which, by illuminating a substrate with exposure light, transfers a predetermined pattern onto a substrate, comprising an exposure apparatus main body which comprises a projection optical system arranged on an optical path of the exposure light; and an optical characteristic measuring unit according to this invention with the projection optical system as the optical system to be examined.

According to this, a given pattern is transferred on a substrate by a projection optical system of which the optical characteristic has been measured accurately by the optical characteristic measuring unit of this invention and adjusted suitably. Therefore, the given pattern can be very accurately transferred on the substrate.

In the exposure apparatus according to this invention, the optical characteristic measuring unit may be attachable to and detachable from the exposure apparatus main body.

According to a sixth aspect of the present invention, there is provided a device manufacturing method including a lithography process, wherein in the lithography process, an exposure apparatus according to this invention performs exposure. According to this, because the exposure apparatus of this invention can very accurately transfer a given pattern onto divided areas, productivity in manufacturing highly integrated devices having a fine circuit pattern can be improved.

DETAILED DESCRIPTION OF THE PREFERRED EMBODIMENTS

An embodiment of the present invention will be described below with reference to FIGS. 1 to 12.

Figure 1:
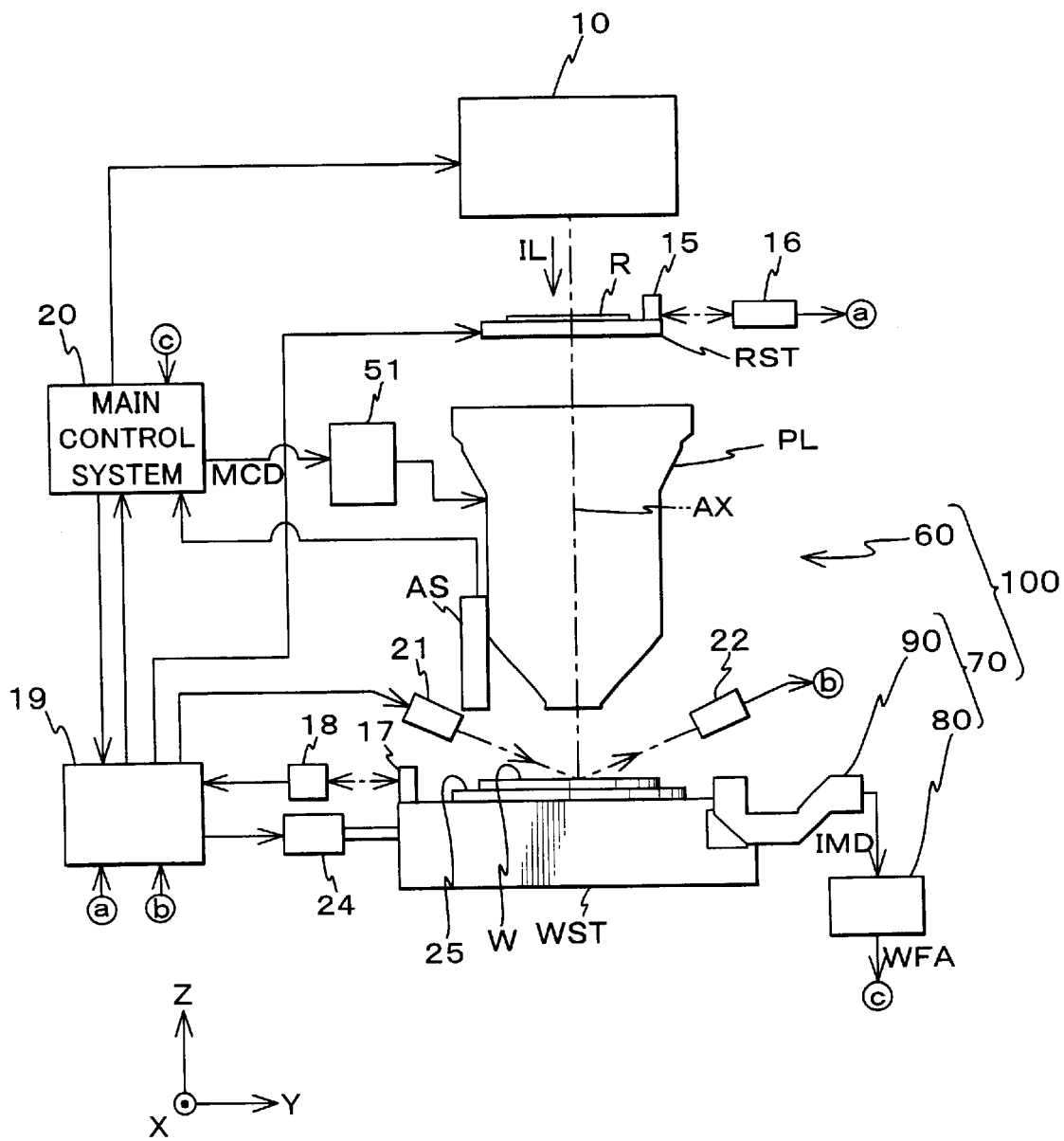
FIG. 1 is a schematic view showing the construction and arrangement of an exposure apparatus according to an embodiment.

FIG. 1 shows the schematic construction and arrangement of an exposure apparatus 100 according to this embodiment, which is a projection exposure apparatus of a step-and-scan type. This exposure apparatus 100 comprises an exposure-apparatus main body 60 and a wave-front-aberration measuring unit 70 as a unit for measuring an optical characteristic.

The exposure-apparatus main body 60 comprises an illumination system 10, a reticle stage RST for holding a reticle R, a projection optical system PL as an optical system to be examined, a wafer stage WST on which a wafer W as a substrate is mounted, an alignment detection system AS, a stage control system 19 for controlling the positions and yaws of the reticle stage RST and the wafer stage WST, a main control system 20 to control the whole apparatus overall and the like.

The illumination system 10 comprises a light source, an illuminance-uniformalizing optical system including a fly-eye lens and the like, a relay lens, a variable ND filter, a reticle blind, a dichroic mirror, and the like (none are shown). The construction of such an illumination system is disclosed in, for example, Japanese Patent Laid-Open No. 10-112433 and U.S. Pat. No. 6,308,013 corresponding thereto. The disclosure in the above Japanese Patent Laid-Open and U.S. patent is incorporated herein by reference as long as the national laws in designated states or elected states, to which this international application is applied, permit. The illumination system 10 illuminates a slit-like illumination area defined by the reticle blind BL on the reticle R having a circuit pattern thereon with exposure light IL having almost uniform illuminance.

On the reticle stage RST, a reticle R is fixed by, e.g., vacuum chuck. The retilce stage RST can be finely driven on an X-Y plane perpendicular to the optical axis (coinciding with the optical axis AX of a projection optical system PL) of the illumination system 10 by a reticle-stage-driving portion (not shown) constituted by a magnetic-levitation-type, two-dimensional linear actuator in order to position the reticle R, and can be driven at specified scanning speed in a predetermined scanning direction (herein, parallel to a Y-direction) Furthermore, in the present embodiment, because the magnetic-levitation-type, two-dimensional linear actuator comprises a Z-driving coil as well as a X-driving coil and a Y-driving coil, the reticle stage RST can be driven in a Z-direction.

The position of the reticle stage RST in the plane where the stage moves is always detected through a movable mirror 15 by a reticle laser interferometer 16 (hereinafter, referred to as a "reticle interferometer") with resolving power of, e.g., 0.5 to 1 nm. The positional information of the reticle stage RST is sent from the reticle interferometer 16 through the stage control system 19 to the main control system 20, and the main control system 20 drives the reticle stage RST via the stage control system 19 and the reticle-stage-driving portion (not shown) based on the positional information of the reticle stage RST.

The projection optical system PL is arranged underneath the reticle stage RST in FIG. 1, whose optical axis AX is parallel to be the Z-axis direction, and is, for example, a reduction optical system that is telecentric bilaterally and that comprises a plurality of lens elements (not shown) whose optical axis AX is parallel to the Z-axis. Moreover, the projection optical system PL has a predetermined reduction ratio β of, e.g. ¼, ⅕, or ⅙. Therefore, when the illumination area of the reticle R is illuminated with the exposure illumination light IL, the image reduced to the reduction ratio β times the size of the circuit pattern's part in the illumination area on the reticle R is projected and transferred onto a slit-like exposure area of the wafer W coated with a resist (photosensitive material) via the projection optical system PL, the reduced image being a partially inverted image.

It is noted that in this embodiment, specific lens elements, e.g. predetermined five lens elements, of the plurality of lens elements are movable independently of each other. The movement of each of such specific lens elements is performed by three driving devices such as piezo devices, provided on the lens element, which support a lens-supporting member supporting the lens element and which connect the lens element to the lens barrel. That is, the specific lens elements can be moved independently of each other and parallel to the optical axis AX by the displacement of driving devices and can be tilted at a given angle to a plane perpendicular to the optical axis AX. And an imaging-characteristic correcting controller 51 controls drive signals applied to the driving devices according to an instruction MCD from the main control system 20, which signals control the respective displacement amounts of the driving devices.

In the projection optical system PL having the above construction, the main control system 20, by controlling the movement of the lens elements via the imaging-characteristic correcting controller 51, adjusts the optical characteristics such as distortion, field curvature, astigmatism, coma and spherical aberration.

The wafer stage WST is arranged on a base (not shown) below the projection optical system in FIG. 1, and on the wafer stage WST a wafer holder 25 is disposed on which a wafer W is fixed by, e.g., vacuum chuck. The wafer holder 25 is constructed to be able to be tilted in any direction with respect to a plane perpendicular to the optical axis of the projection optical system PL and to be able to be finely moved in the direction of the optical axis AX (the Z-direction) of the projection optical system PL by a driving portion (not shown). The wafer holder 25 can also rotate finely about the optical axis AX.

Furthermore, on the side in the +Y direction of the wafer stage WST, a bracket structure is formed to which a wave front sensor 90 described later is attachable.

The wafer stage WST is constructed to be able to move not only in the scanning direction (the Y-direction) but also in a direction perpendicular to the scanning direction (the X-direction) so that a plurality of shot areas on the wafer can be positioned at an exposure area conjugated to the illumination area. And the wafer stage WST is driven in the X- and Y-directions by a wafer-stage driving portion 24 comprising a motor, etc.

The position of the wafer stage WST in the X-Y plane is always detected through a movable mirror 17 by a wafer laser interferometer with resolving power of, e.g., 0.5 to 1 nm. The positional information (or velocity information) of the wafer stage WST is sent through the stage control system 19 to the main control system 20, and based on the positional information (or velocity information), the main control system 20 controls the movement of the wafer stage WST via the stage control system 19 and wafer-stage driving portion 24.

In this embodiment, the alignment detection system AS is a microscope of an off-axis type which is provided on the side face of the projection optical system PL and which comprises an imaging-alignment sensor observing street-lines and position detection marks (fine-alignment marks) formed on the wafer. The construction of such an alignment detection system is disclosed in detail in, for example, Japanese Patent Laid-Open No. 9-219354 and U.S. Pat. No. 5,859,707 corresponding thereto. The disclosure in the above Japanese Patent Laid-Open and U.S. patent is incorporated herein by reference as long as the national laws in designated states or elected states, to which this international application is applied, permit. The alignment detection system AS supplies observation results to the main control system 20.

Furthermore, in the apparatus of FIG. 1, a multi-focus-position detection system (21, 22) is provided which detects positions in the Z-direction (optical axis direction) of areas within and around the exposure area of the surface of the wafer W and which is a focus detection system of an oblique-incidence type. The multi-focal detection system (21, 22) comprises a illumination optical system 21 composed of a bundle of optical fibers, a condenser lens, a pattern forming plate, a lens, a mirror, and an illumination objective lens (none are shown) and a light-receiving optical system 22 composed of a focusing objective lens, a rotationally-vibrating plate, an imaging lens, a slits-plate for receiving light, and a detector having a plurality of photosensors (none are shown). The construction of such a multi-focal detection system is disclosed in detail in, for example, Japanese Patent Laid-Open No. 6-283403 and U.S. Pat. No. 5,448,332 corresponding thereto. The disclosure in the above Japanese Patent Laid-Open and U.S. Patent is incorporated herein by reference as long as the national laws in designated states or elected states, to which this international application is applied, permit. The multi-focal detection system (21, 22) supplies detection results to the stage control system 19.

The wave-front-aberration measuring unit 70 comprises a wave-front sensor 90 and a wave-front-data processing unit 80.

Figure 2:
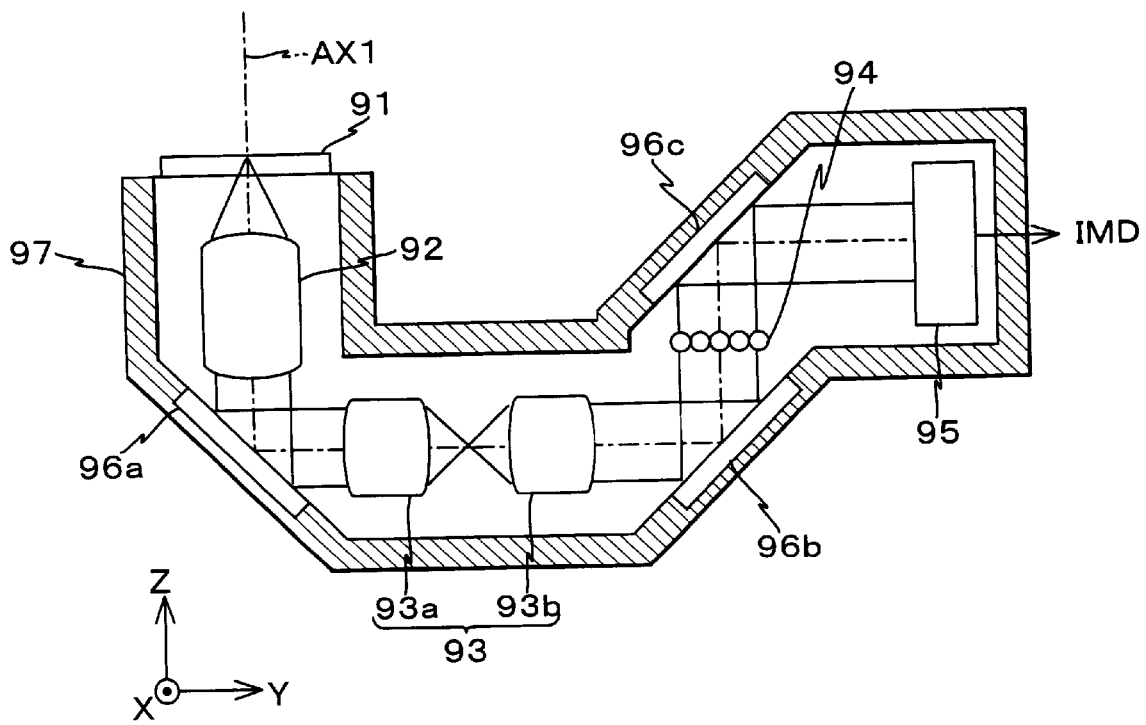
FIG. 2 is a schematic view showing the construction of a wave front sensor in FIG. 1.

The wave-front sensor 90, as shown in FIG. 2, comprises a mark plate 91, a collimator lens 92, a relay lens system 93 composed of lenses 93a and 93b, a micro-lens array 94 as a device for dividing wave-fronts, and a CCD 95 as an image-picking-up unit, which are arranged sequentially in that order on the optical axis AX1. Moreover, the wave-front sensor 90 further comprises mirrors 96a, 96b, 96c for setting the optical path of light incident on the wave-front sensor 90, and a housing member 97 housing the collimator lens 92, the relay lens system 93, the micro-lens array 94, the CCD 95 and the mirrors 96a, 96b, 96c.

Figure 3:
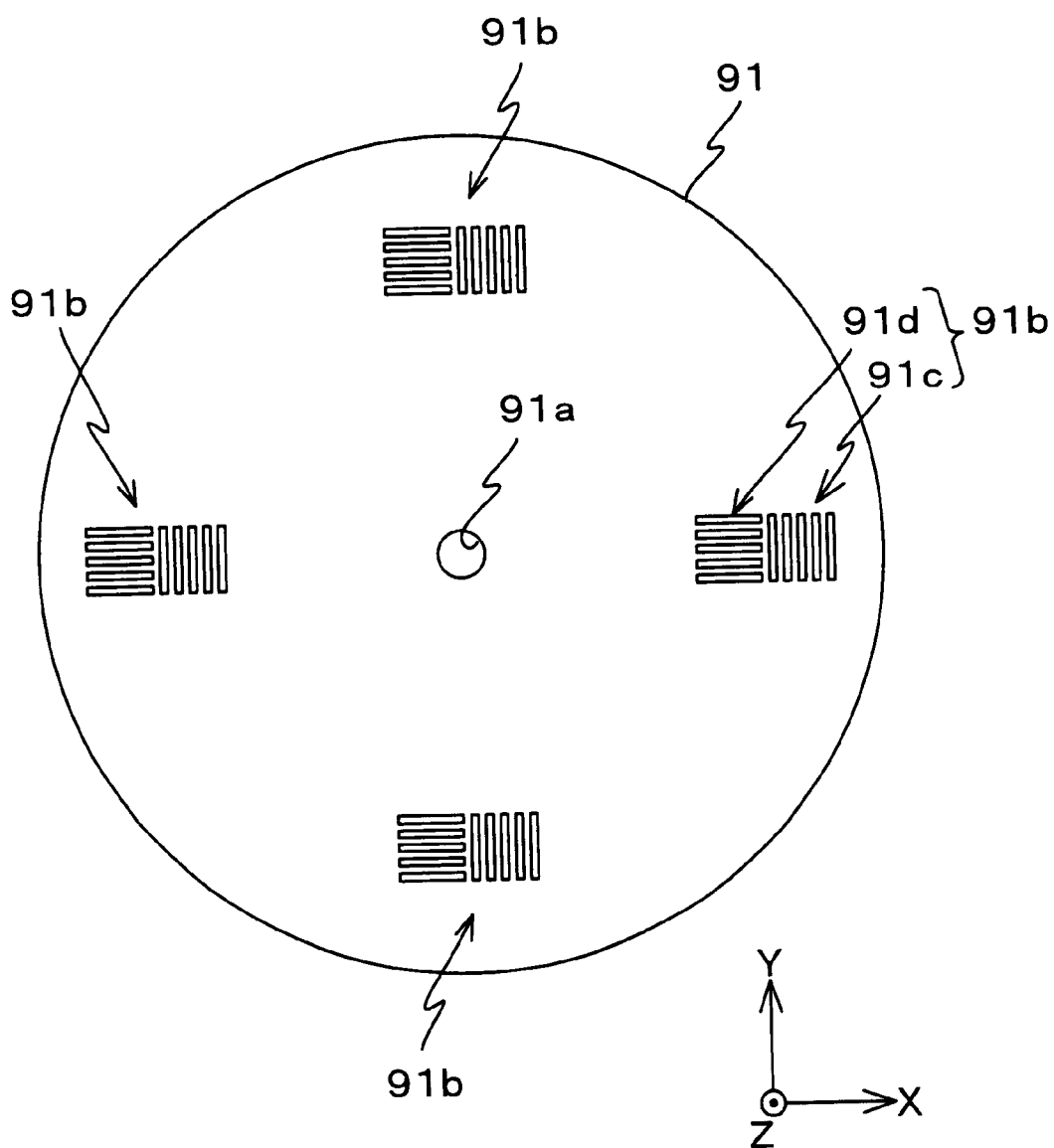
FIG. 3 is a view for explaining the surface state of a mark plate in FIG. 2.

The mark plate 91 is made using a glass substrate as the substrate and is disposed such that the position in the Z-direction thereof is the same as the surface of the wafer W fixed on the wafer holder 25 while the surface thereof is perpendicular to the direction parallel to the optical axis AX1 (refer to FIG. 1). An opening 91a is made in the center of the mark plate 91 as shown in FIG. 3. Furthermore, formed around the opening 91a on the surface of the mark plate 91 are more than two, four in FIG. 3, two-dimensional position-detection marks 91b. In this embodiment, the two-dimensional position-detection mark 91b comprises a line-and-space mark 91c having lines extending in the X-direction and a line-and-space mark 91d having lines extending in the Y-direction. It is remarked that the line-and-space marks 91c, 91d can be observed by the above alignment detection system AS. Moreover, the other part of the surface of the mark plate 91 than the opening 91a and the two-dimensional position-detection mark 91b is made reflective by, for example, depositing chrome (Cr) on the glass substrate.

Referring back to FIG. 2, the collimator lens 92 produces parallel rays of light from light incident through the opening 91a.

Figure 4A:
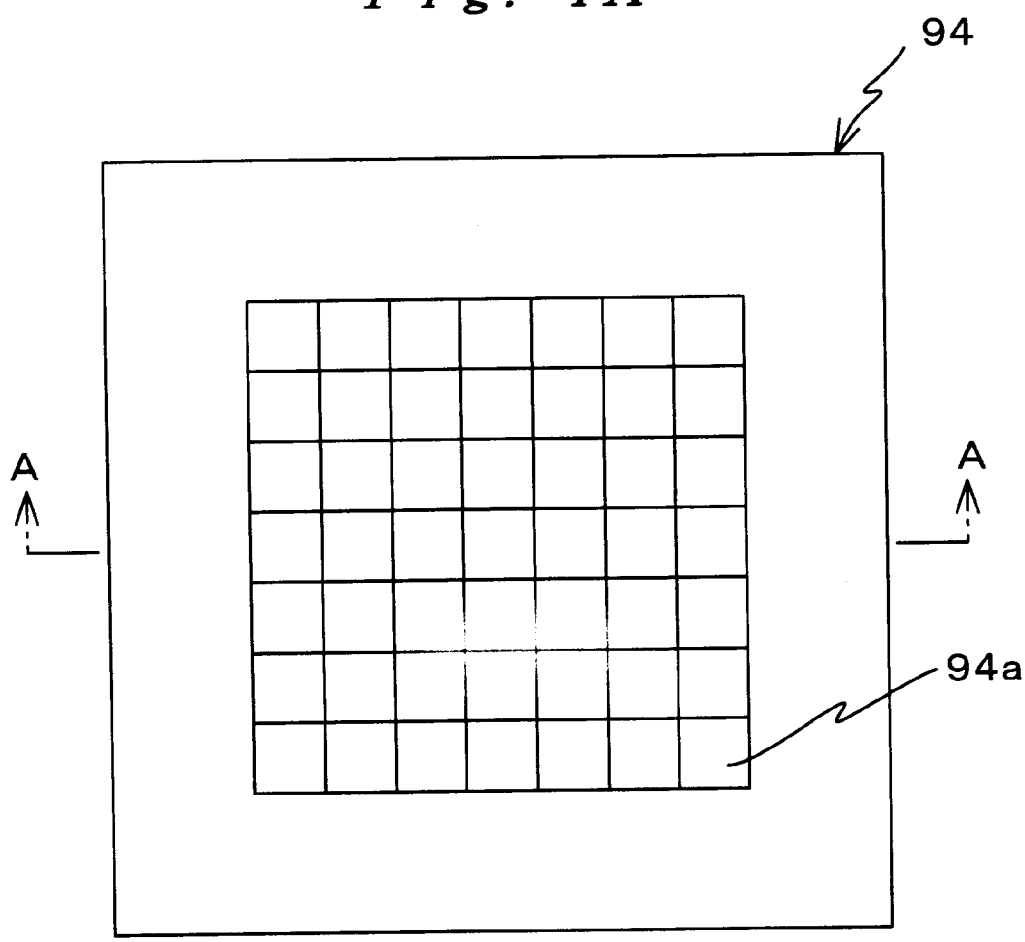
FIGS. 4A and 4B are views for explaining the construction of a micro lens array in FIG. 2.
Figure 4B:
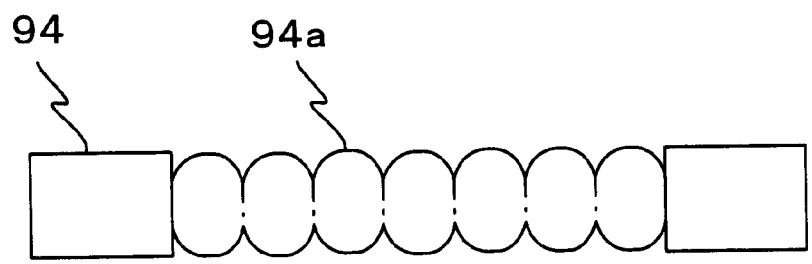

The micro-lens array 94, as shown in FIGS. 4A and 4B, has a lot of micro lenses 94a having a positive refractive power, which are square in the plan view, which are arranged in a matrix arrangement and adjacent to each other, and whose optical axes are substantially parallel to each other. It is remarked that FIGS. 4A and 4B show micro lenses 94a arranged in a matrix with 7 rows and 7 columns as an example. The micro lenses 94a may be rectangle in the plan view, not being limited to the square, or all may not have the same shape. Moreover, in the micro-lens array 94 the micro lenses 94a may be arranged with uneven pitches or obliquely.

The micro-lens array 94 is made by etching a plane parallel plate, and each micro lens 94a of the micro-lens array 94 focuses rays of light incident through the relay lens system 93 and forms the image in the opening 91a in a respective position.

The optical system comprising the collimator lens 92, the relay lens system 93, the micro-lens array 94 and the mirrors 96a, 96b, 96c is called a wave-front-aberration measuring optical system, hereinafter.

Referring back to FIG. 2, the CCD 95 is disposed a predetermined distance apart from the micro-lens array 94, specifically on an image plane on which pinhole images, described later, are formed by the micro lenses 94a, the pinhole images being ones of a pinhole image formed on the opening 91a. That is, the CCD 95 has a light-receiving plane conjugate to the plane where the opening 91a of the wave-front-aberration measuring optical system is made, and picks up the lot of pinhole images formed on the light-receiving plane. The pick-up result as pick-up data IMD is supplied to the wave-front-data processing unit 80.

The housing member 97 has supporting members (not shown) for supporting the collimator lens 92, the relay lens system 93, the micro-lens array 94 and the CCD 95 respectively. It is remarked that the reflection mirrors 96a, 96b, 96c are fixed to the inner surface of the housing member 97. Furthermore, the housing member 97 has such an outer shape that it is fitted into the bracket structure of the wafer stage WST and is attachable to and detachable from the wafer stage WST.

Figure 5:
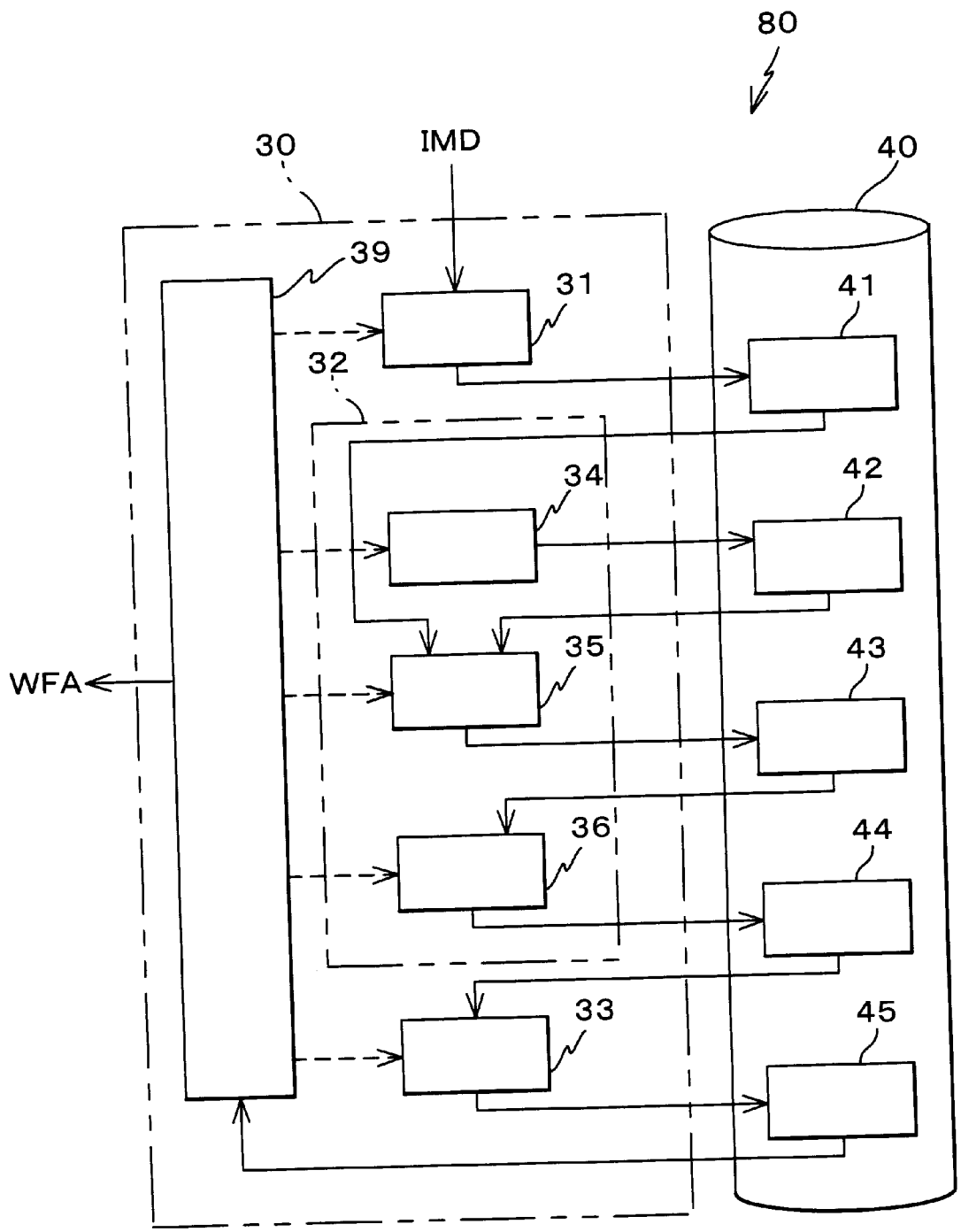
FIG. 5 is a block diagram showing the construction of a main control system in FIG. 1.

The wave-front-data processing unit 80 comprises a main controller 30 and a storage unit 40 as shown in FIG. 5. The main controller 30 comprises (a) a controller 39 for controlling the overall action of the wave-front-data processing unit 80 and supplying wave-front measurement result data WFA to the main control system 20, (b) a pick-up data collecting unit 31 for collecting pick-up data IMD from the wave-front sensor 90, (c) a position-detecting unit 32 for detecting the positions of spot-images based on the pick-up data and (d) a wave-front-aberration calculating unit 33 for calculating the wave-front aberration of the projection optical system PL.

The position-detecting unit 32 comprises (i) a template-generating unit 34 as a template-preparing unit for generating a template for each of positions within a picture element which template corresponds to a reference image whose center is located at the position, the reference image being represented by, for example, a SYNC function, (ii) a correlation-value computing unit 35 for, by calculating correlation-values between a spot-image picked up and the templates, obtaining the position of a maximum template whose correlation-value is maximal, and (iii) a spot-image-position calculating unit 36 as an image-position calculating unit for calculating a curved-surface function that fits the distribution of correlation-values the center of which distribution is in the maximum template's position and obtaining the position of the spot-image based on the curved-surface function.

In addition, the storage unit 40 comprises (a) a pick-up data storing area 41 for storing pick-up data, (b) a template storing area 42 for storing templates, (c) a correlation-value storing area 43 for storing correlation-values and maximum templates' positions calculated, (d) a spot-image-position storing area 44 for storing spot-image-positions, and (e) a wave-front-aberration-data storing area 45 for storing wave-front-aberration data.

While, in this embodiment, the main controller 30 comprises the various units as described above, the main controller 30 may be a computer system where the functions of the various units are implemented as program modules installed therein.

Next, the exposure operation of the exposure apparatus 100 of this embodiment will be described with reference to a flow chart in FIG. 6 and other figures as needed.

As a premise of the operation it is assumed that the wave-front sensor 90 is mounted on the wafer stage WST and that the wave-front-data processing unit 80 is connected to the main control system 20.

Moreover, it is assumed that the positional relation between the opening 91a of the mark plate 91 of the wave-front sensor 90 fixed to the wafer stage and the wafer stage WST has been measured by observing the two-dimensional position-detection marks 91b through the alignment detection system AS. That is, the assumption is that the X-Y position of the opening 91a can be accurately detected based on position information (or speed information) from a wafer interferometer 18, and that by controlling the movement of the wafer stage WST via the wafer-stage driving portion 24, the opening 91a can be accurately positioned at a desired X-Y position. In this embodiment, the positional relation between the opening 91a and the wafer stage WST is accurately detected, based on detection result of the positions of the four two-dimensional position-detection marks 91b through the alignment detection system AS, using a statistical method such as EGA (Enhanced Global Alignment) disclosed in, for example, Japanese Patent Laid-Open No. 61-44429 and U.S. Pat. No. 4,780,617 corresponding thereto. The disclosure in the above Japanese Patent Laid-Open and U.S. patent is incorporated herein by reference as long as the national laws in designated states or elected states, to which this international application is applied, permit.

Let $\Delta$ indicate the dimensions in the X- and Y-directions of a picture element, and it is assumed that templates with which correlation-values of the image data of a picked-up spot-image are calculated have been obtained by the template-generating unit 34 and stored in the template storing area 42.

Such a template represents a distribution J[m,n] of image data in the case where the center of an ideal spot-image (reference image) denoted by, e.g., a SYNC function is located in (m×($\Delta$/M), n×($\Delta$/N)), where M=N=10, m=−4 through 5 and n=−4 through 5, setting the center of a picture element as an X-Y origin. FIGS. 7A through 7E show bar graphs representing templates J[m,n] (n=0, m=0, −1, −2, −3, −4) as examples that are one-dimensional distributions along an X-axis. In FIGS. 7A through 7E broken curves indicate ideal spot-images I(X,0).

Figure 6:
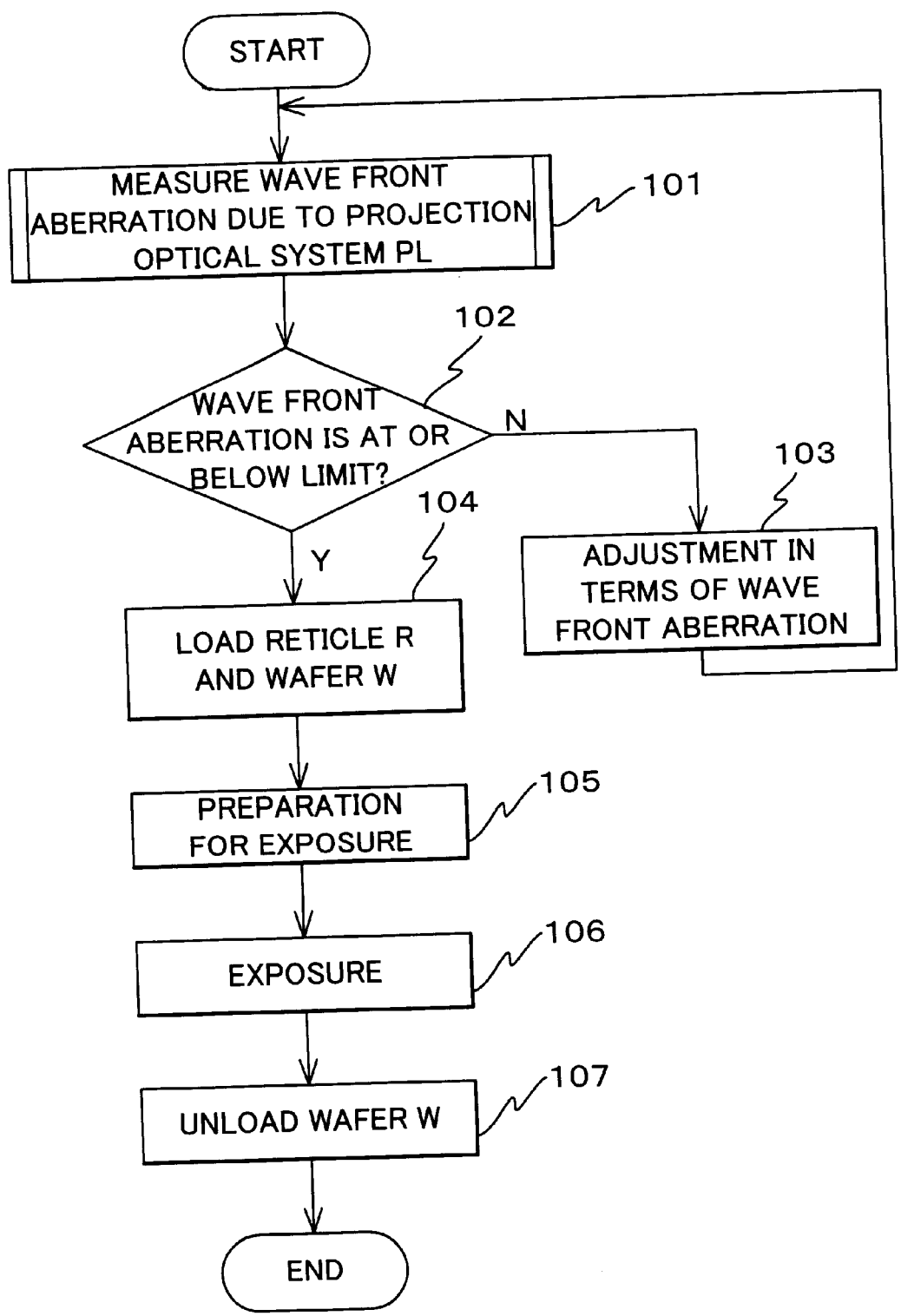
FIG. 6 is a flow chart for explaining the exposure process by the apparatus of FIG. 1.
Figure 7:
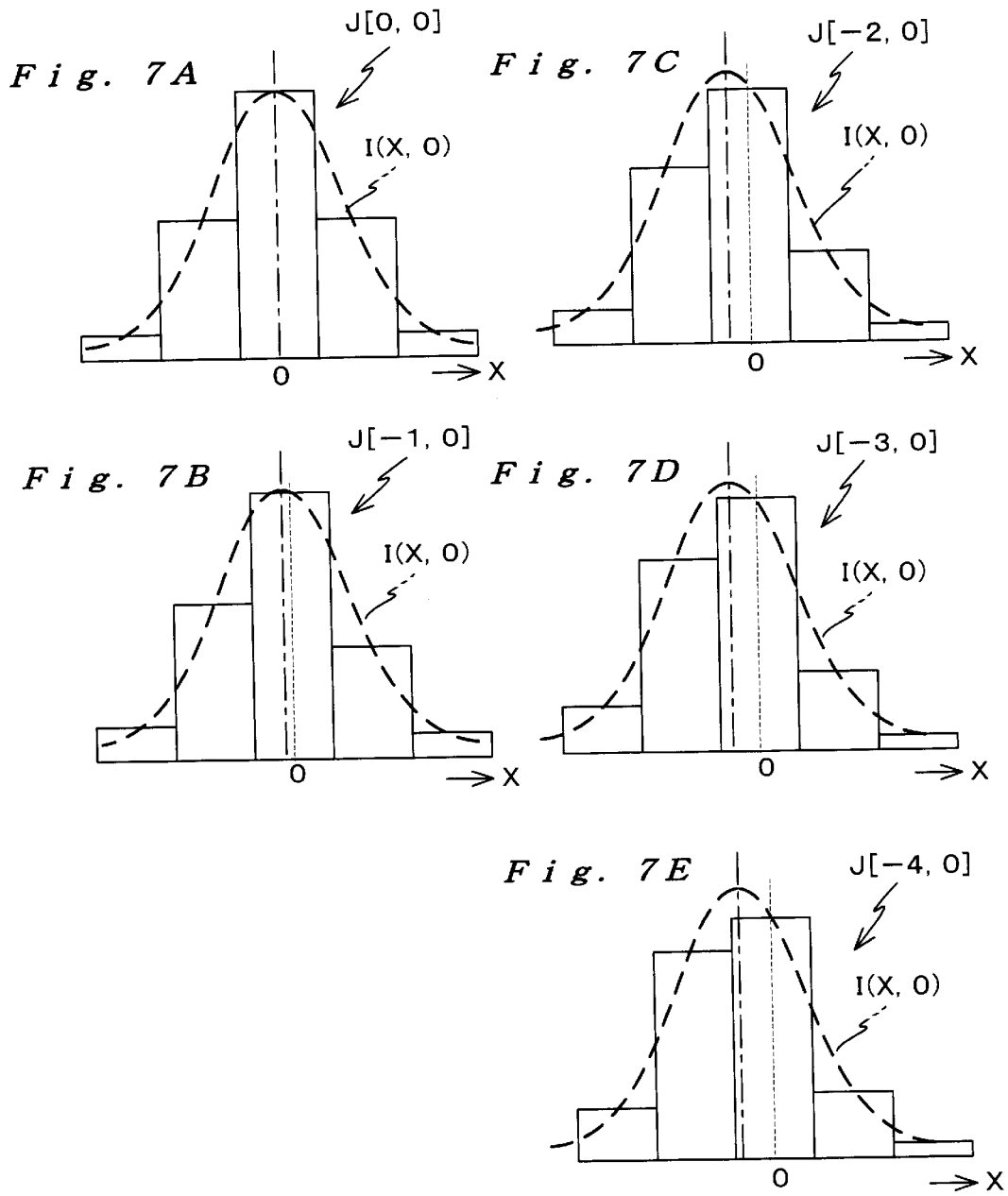
FIGS. 7A to 7E are views for explaining examples of the template.
Figure 8:
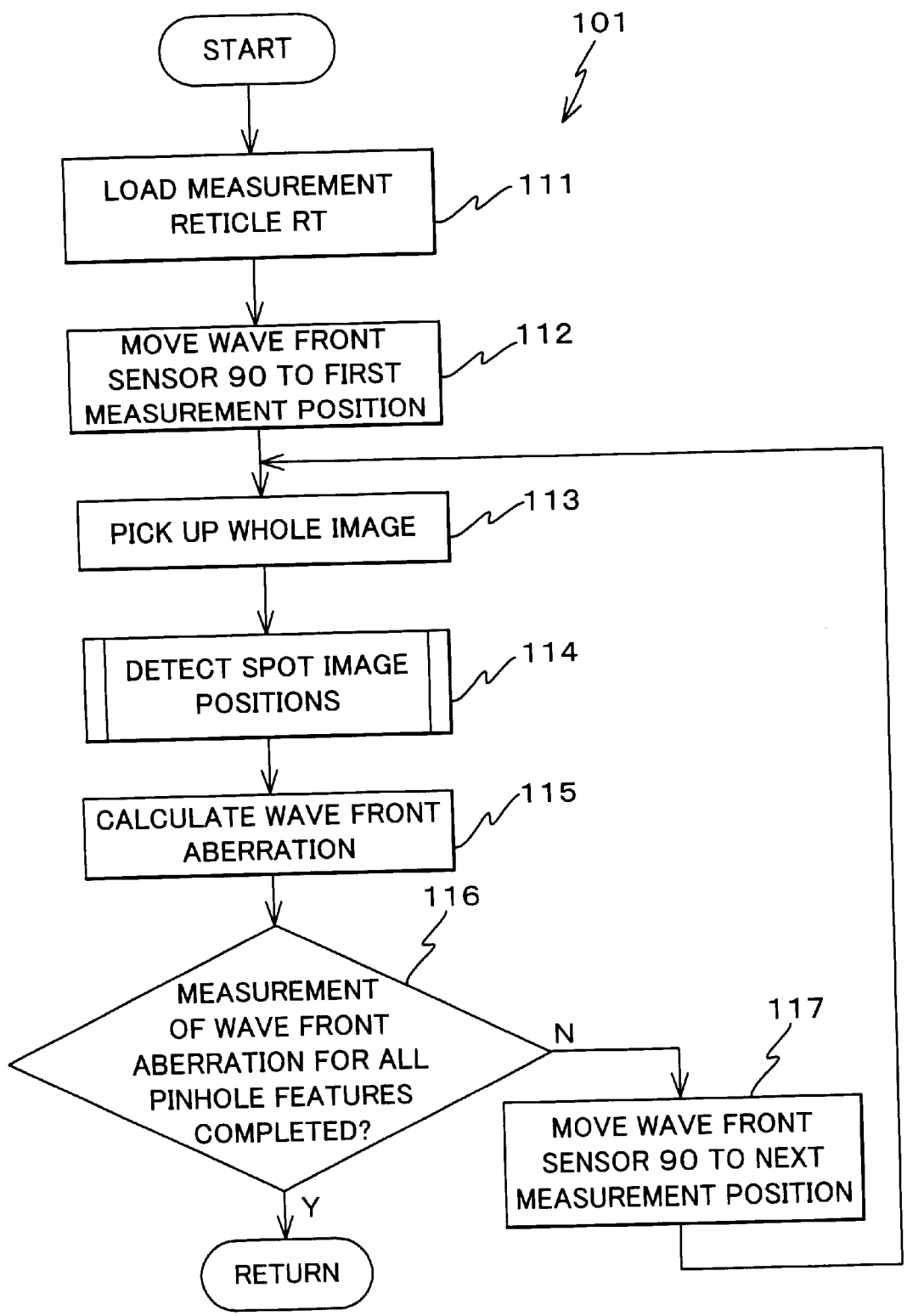
FIG. 8 is a flow chart for explaining the process in an aberration measuring subroutine of FIG. 6.
Figure 9:
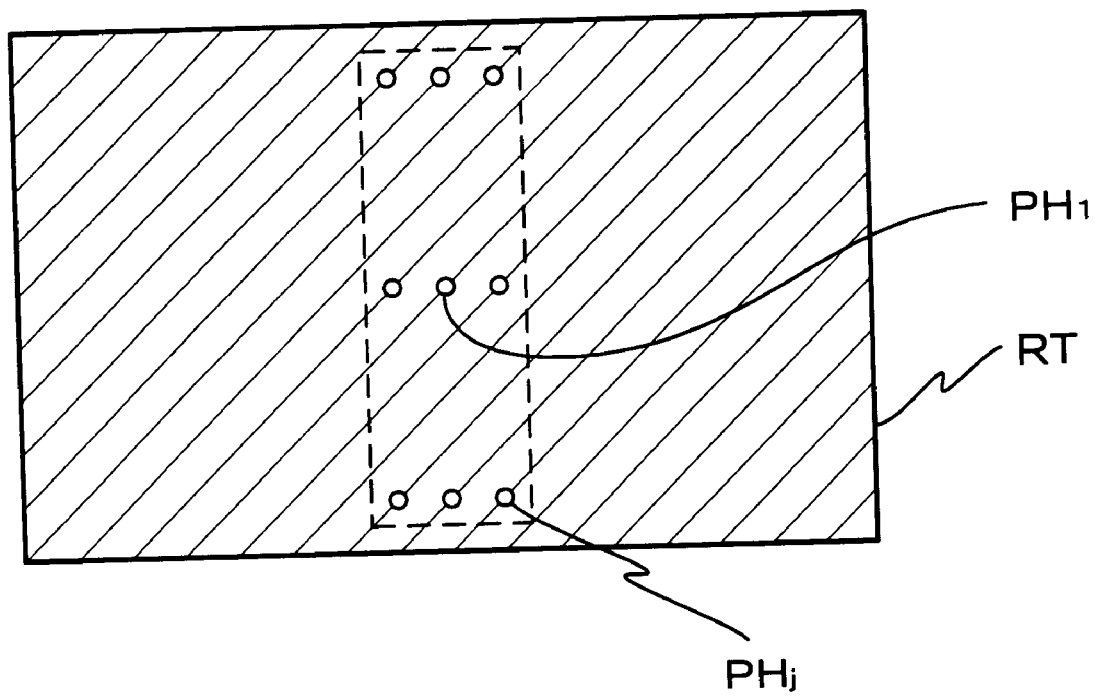
FIG. 9 is a view showing an exemplary measurement pattern formed on a measurement reticle.

In the process shown in FIG. 6, first in a subroutine 101, the wave-front aberration of the projection optical system PL is measured. In a step 111 of the measuring of the wave-front aberration, as shown in FIG. 8, a reticle loader (not shown) loads a measurement reticle RT, shown in FIG. 9, for measuring the wave-front aberration onto the reticle stage RST. FIG. 9 shows the measurement reticle RT on which a plurality of pinhole-like features $PH_1$ through $PH_N$, N=9 in FIG. 9, are formed in a matrix arrangement, whose rows are parallel to the Y-direction and whose columns are parallel to the X-direction. It is noted that the pinhole-like features $PH_1$ through $PH_N$ are formed within an area having the size of the slit-like illumination area, which is enclosed by dashed lines in FIG. 9.

Subsequently, reticle alignment using a reference mark plate (not shown) fixed on the wafer stage WST and measurement of base-line amount through the alignment detection system AS are performed. And the reticle stage RST is moved for measuring the wave-front aberration such that the first pinhole-like feature $PH_1$ is positioned on the optical axis AX of the projection optical system PL, which movement the main control system 20 controls via the stage control system 19 and the reticle-stage driving portion based on position information (or speed information) of the reticle stage RST from the reticle interferometer 16.

Referring back to FIG. 8, in a step 112 the wafer stage WST is moved so that the opening 91a of the mark plate 91 of the wave-front sensor 90 is positioned at a position conjugate to the pinhole-like feature $PH_1$ with respect to the projection optical system PL, which position is on the optical axis AX. The main control system 20 controls such movement via the stage control system 19 and the wafer-stage driving portion 24 based on position information (or speed information) of the wafer stage WST from a wafer interferometer 18. The main control system 20 drives the wafer stage WST finely in the Z-direction via the wafer-stage driving portion 24 based on the detection result from the multi-focal detection system (21, 22) so that the image plane on which the pinhole-like feature $PH_1$ is imaged coincides with the upper surface of the mark plate 91 of the wave-front sensor 90.

Figure 10:
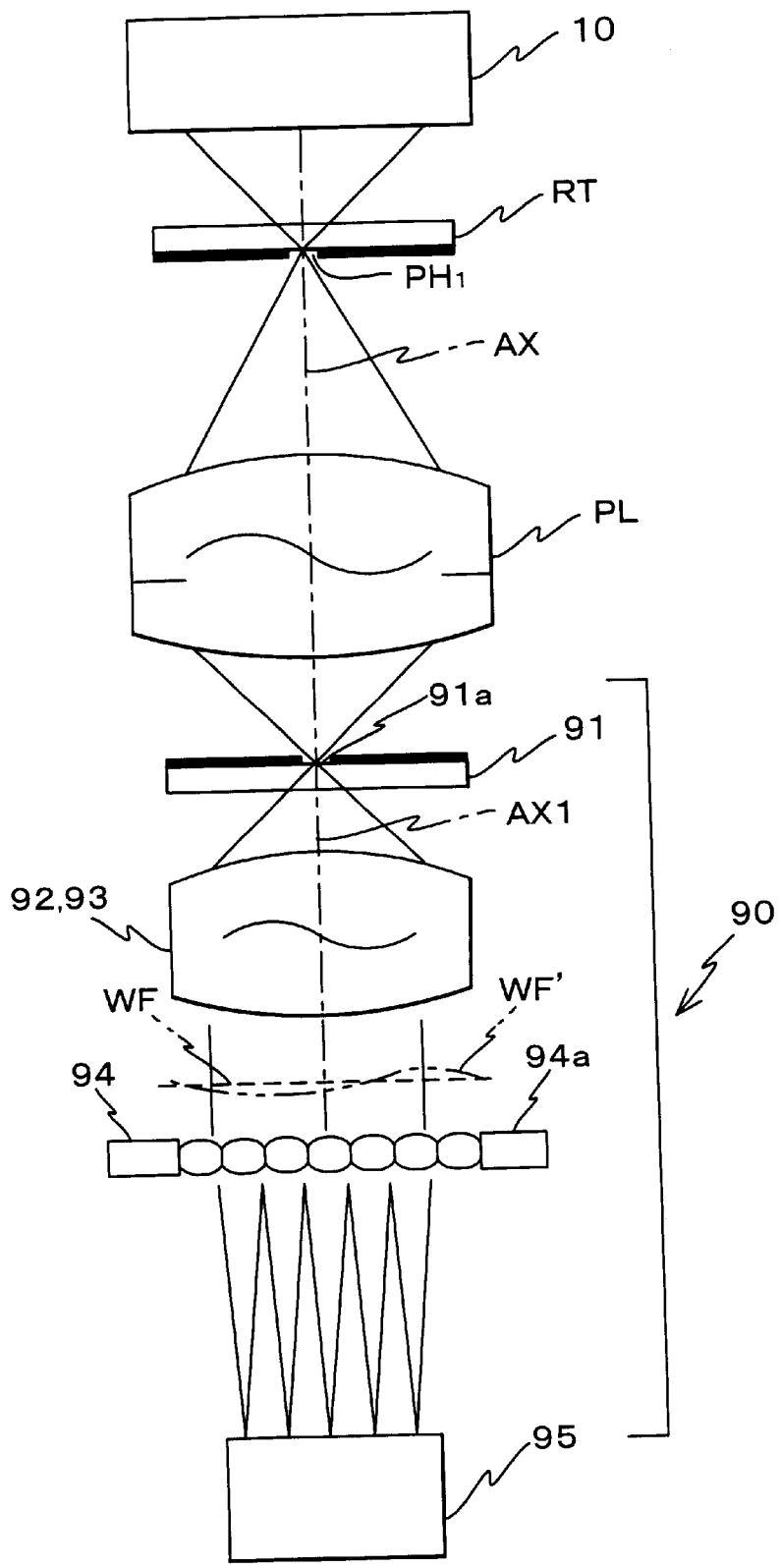
FIG. 10 is a view for explaining an optical arrangement in measuring wave front aberration.

By this, positioning of components for measuring the wave-front aberration using a spherical wave from the first pinhole-like feature $PH_1$ is completed. FIG. 10 shows the optical arrangement of the components with centering the optical axis AX1 of the wave-front sensor 90 and the optical axis AX of the projection optical system PL in the drawing.

In this optical arrangement, the illumination light IL from the illumination system 10 reaches the first pinhole-like feature $PH_1$ on the measurement reticle RT, which sends out the light being a spherical wave. The spherical wave is focused on the opening 91a of the mark plate 91 of the wave-front sensor 90 through the projection optical system PL. It is remarked that light passing through the pinhole-like features $PH_2$ through $PH_N$ other than the first pinhole-like feature $PH_1$ do not reach the opening 91a. The wave front of the light focused on the opening 91a is almost spherical with wave-front aberration due to the projection optical system PL.

It is noted that the measurement result of the wave-front of light may include components due to position deviation of the upper surface of the mark plate 91 of the wave-front sensor 90 from the image plane of the projection optical system PL, on which a pinhole image of the pinhole-like feature $PH_1$ is formed, as well as the wave-front aberration due to the projection optical system PL, which components are caused by tilt, position deviation in the optical-axis direction and so forth. Therefore, the position of the wafer stage WST is controlled based on the deviation components calculated based on wave-front-aberration data obtained by the wave-front-aberration measuring unit 70, so that very accurate wave-front-aberration measurement is possible.

The collimator lens 92 produces from the light having passed through the opening 91a parallel rays of light, which is made incident on the micro-lens array 94 via the relay lens system 93. Here, the wave-front of the light incident on the micro-lens array 94 has wave-front aberration due to the projection optical system PL. That is, while if the projection optical system PL does not cause wave-front aberration, the wave-front WF is, as shown by a dashed line in FIG. 10, a plane perpendicular to the optical axis AX1, if the projection optical system PL causes wave-front aberration, the wave-front WF' varies in angle relative to the plane according to position as shown by a two-dot chain line in FIG. 10.

In the micro-lens array 94, each micro lens 94a images the image of the pinhole-like feature $PH_1$ on the opening 91a on the pick-up plane of CCD 95 conjugate to the mark plate 91. If the wave-front of the light incident on the micro lens 94a is perpendicular to the optical axis AX1, the spot-image centered at the intersection point between the optical axis of the micro lens 94a and the image plane is formed on the image plane. If the wave-front of the light incident on the micro lens 94a is oblique to the optical axis AX1, the spot-image centered at a point a distance apart from the intersection point between the optical axis of the micro lens 94a and the image plane is formed on the image plane, the distance varying according to the angle of the line tangent to the wave-front.

Referring back to FIG. 8, in a step 113 the CCD 95 picks up an image formed on the image plane, from which pick-up data IMD is obtained and supplied to the wave-front-data processing unit 80. In the wave-front-data processing unit 80, the pick-up data collecting unit 31 collects the pick-up data IMD and stores in the pick-up data storing area 41.

Figure 11:
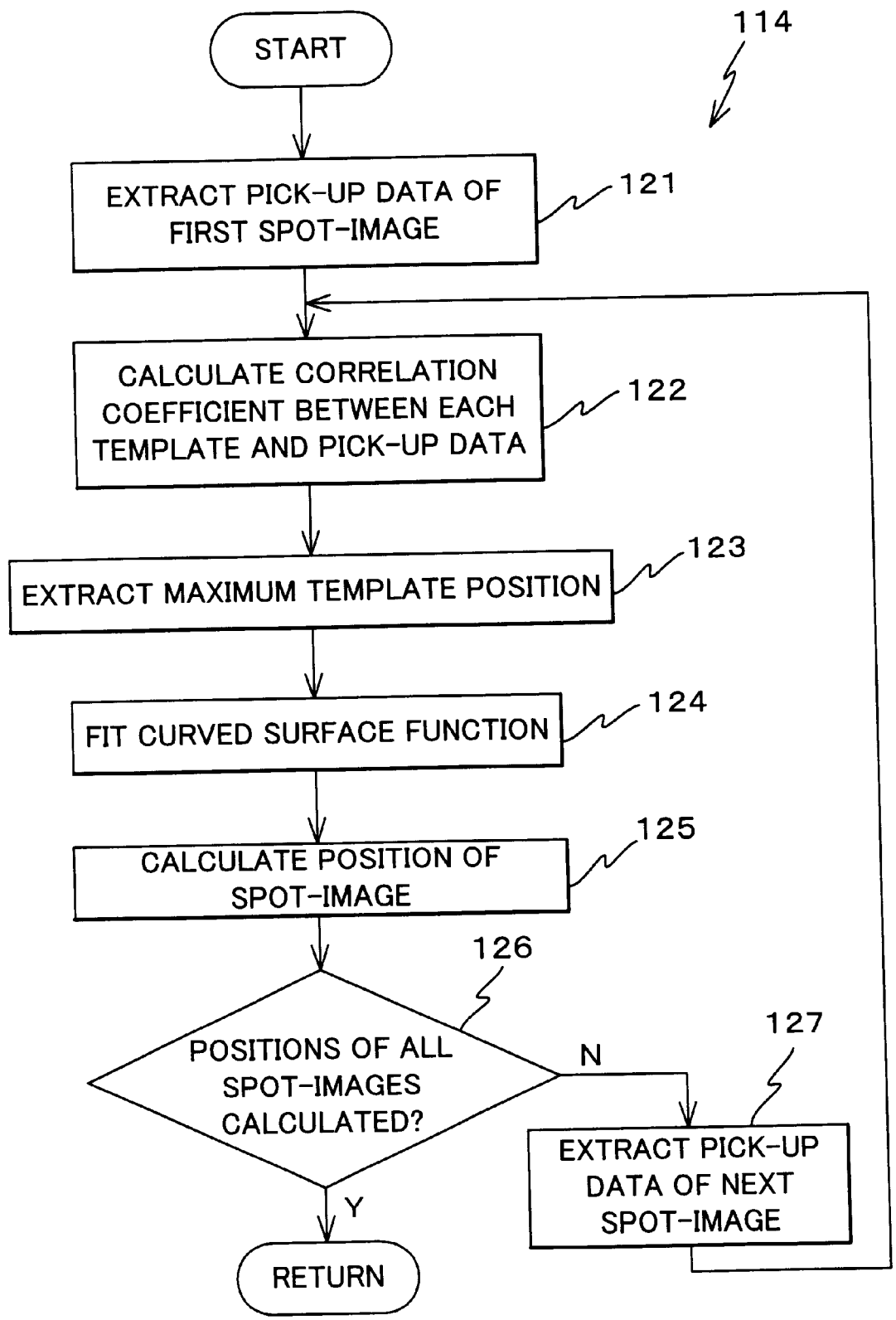
FIG. 11 is a flow chart for explaining the process in a spot-image positions detecting subroutine of FIG. 8.

Next, in a subroutine 114, the position of each spot-image is detected based on the pick-up result. In a step 121 of the subroutine 114, as shown in FIG. 11, the correlation-value computing unit 35 of the position-detecting unit 32 reads out pick-up data from the pick-up data storing area 41 and extracts an area where a first spot-image is formed. In the extraction, the correlation-value computing unit 35 searches for, e.g., two-dimensional peaks having a peak at or above a predetermined value in the pick-up data, and taking a plurality of two-dimensional peaks as spot-images, extracts the first spot-image area.

Subsequently, in a step 122 the correlation-value computing unit 35 reads out templates J[m,n] from the template storing area 42, and calculates correlation-values CF[m,n] between the data distribution in the first spot-image area and the templates J[m,n] for which the origin is present in the center of the picture element where the peak of the data distribution is present. In the below description, the center of an ideal spot-image corresponding to a template J[m,n] is called a "template position", and the template position of the template J[m,n] is denoted by [m,n].

Next, in a step 123 the correlation-value computing unit 35 obtains the position of a maximum template whose correlation-value is the maxium of the correlation-values CF[m,n] calculated, which position is denoted by $[m_0, n_0]$ hereafter. It is remarked that the maximum template position $[m_0, n_0]$ calculated in this way is an estimated position of the spot-image with accuracy according to the position resolving power ($\Delta$/M in the X-direction, $\Delta$/N in the Y-direction) in generating the templates J[m,n].

And the correlation-value computing unit 35 stores the correlation-values CF[m,n] and the maximum template position [$m_0,n_0$] in the correlation-value storing area 43.

Next, in a step 124 in order to improve accuracy in estimating an estimated position of the spot-image, the spot-image-position calculating unit 36 of the position-detecting unit 32 reads out the correlation-values CF[m,n] and the maximum template position [$m_0,n_0$] from the correlation-value storing area 43 and calculates a continuous curved surface function CF(X,Y) that fits the distribution of correlation-values CF[m,n] in and around the maximum template position [$m_0,n_0$]. In this embodiment, nine correlation-values CF[$m_0-1,n_0-1$], CF[$m_0-1,n_0$], CF[$m_0-1,n_0+1$], CF[$m_0,n_0-1$], CF[$m_0,n_0$], CF[$m_0,n_0+1$], CF[$m_0+1,n_0-1$], CF[$m_0+1,n_0$], and CF[$m_0+1,n_0+1$] are taken in calculating a fitting curved surface function CF(X,Y) given by the following expression $$CF(X,Y) = a_0 + a_1 \cdot X + a_2 \cdot Y + a_3 \cdot X^2 + a_4 \cdot X \cdot Y + a_5 \cdot Y^2. \quad (1)$$

Substituting information from the nine correlation-values into this function gives a simultaneous equation composed of nine equations, from which the six coefficients $a_0$ through $a_5$ are calculated. Here, because the number of the equations is nine while the number of the unknown values is six, the simultaneous equation cannot be deterministically solved. Therefore, the spot-image-position calculating unit 36 calculates an optimum solution by the least-squares method.

Subsequently, in a step 125 the spot-image-position calculating unit 36 obtains a position ($X_0,Y_0$) where the curved surface function CF(X,Y) having the calculated coefficients takes on a locally maximum value in or near the maximum template position [$m_0,n_0$] by using the following equations (2) and (3)

$$\partial[CF(X,Y)]/\partial X = 0 \quad (2)$$

$$\partial[CF(X,Y)]/\partial Y = 0. \quad (3)$$

The spot-image-position calculating unit 36 stores the position ($X_0,Y_0$) as the spot-image position in the spot-image-position storing area 44.

Next, a step 126 checks whether or not positions of all spot images are detected. At this stage the answer is NO because only the first spot-image position has been detected, and the process proceeds to a step 127.

In the step 127 the correlation-value computing unit 35 extracts the area of a next spot-image. After that, until the answer in the step 126 becomes YES, the steps 122 through 127 are repeated. Positions of spot-images are sequentially detected and stored in the spot-image-position storing area 45 likewise. And when the answer in the step 126 becomes YES, the process proceeds from the subroutine 114 to a step 115 in FIG. 8.

In the step 115 the wave-front-aberration calculating unit 33 reads out the detection result of the spot image positions from the position data storing area 42 and calculates the wave-front-aberration of light through the first pinhole-like feature $PH_1$ of the measurement reticle RT due to the projection optical system PL. The wave-front-aberration is given by calculating the coefficients of Zernike polynomials based on the differences between spot image positions expected if no wave-front-aberration exists and the spot image positions detected, and is stored together with the position of the pinhole-like feature $PH_1$ in the wave-front-aberration-data storing area 45.

Next, a step 116 checks whether or not the wave-front-aberration due to the projection optical system PL for all the pinhole-like features have been calculated. Because at this point of time only that for the first pinhole-like feature $PH_1$ has been calculated, the answer is NO, and the process proceeds to a step 117.

In the step 117 the wafer stage WST is moved so that the opening 91a of the mark plate 91 of the wave-front sensor 90 is positioned at a position conjugate to the pinhole-like feature $PH_2$ with respect to the projection optical system PL. The main control system 20 controls such movement via the stage control system 19 and the wafer-stage driving portion 24 based on position information (or speed information) of the wafer stage WST from the wafer interferometer 18. Also in this case, the main control system 20 drives the wafer stage WST finely in the Z-direction via the wafer-stage driving portion 24 based on a detection result from the multi-focal detection system (21, 22) so that the image plane on which the pinhole-like feature $PH_2$ is imaged coincides with the upper surface of the mark plate 91 of the wave-front sensor 90.

Also when moving the upper surface of the mark plate 91 of the wave-front sensor 90 to the image plane on which an image of the pinhole-like feature $PH_2$ is formed, the position of the wafer stage WST is, as described above, controlled based on the components, due to position deviation of the upper surface of the mark plate 91 from the image plane of the projection optical system PL, calculated based on wave-front-aberration data obtained by the wave-front-aberration measuring unit 70, which control is preferably performed for each pinhole-like feature.

Subsequently, the wave-front-aberration due to the projection optical system PL is measured in the same way as for the pinhole-like feature $PH_1$ and the measurement result is stored together with the position of the pinhole-like feature $PH_2$ in the wave-front-aberration-data storing area 45.

After that, the wave-front-aberrations due to the projection optical system PL for all the pinhole-like features are sequentially measured likewise and stored in the wave-front-aberration-data storing area 45. When the wave-front-aberrations due to the projection optical system PL for all the pinhole-like features have been measured, the answer in the step 116 is YES. And the controller 39 reads out the measurement results of the wave-front-aberrations from the wave-front-aberration-data storing area 45 and supplies them as wave-front-measurement data WFA to the main control system 20. Then the process proceeds to a step 102 in FIG. 6.

In the step 102, the main control system 20 checks based on the wave-front-measurement data WFA from the controller 39 whether or not the wave-front-aberrations due to the projection optical system PL are at or below a permissible limit. While, if the answer is YES, the process proceeds to a step 104, if the answer is NO, the process proceeds to a step 103. At this point of time the answer is NO, and the process proceeds to the step 103.

In the step 103, the main control system 20 adjusts the projection optical system PL based on the wave-front-aberration measurement results so as to reduce the wave-front-aberration. In the adjustment the controller 39 may move the lens elements via the imaging-characteristic correcting controller 51 or, if necessary, the lens elements of the projection optical system PL may be manually moved on the X-Y plane or replaced.

Subsequently, in the subroutine 101 the wave-front-aberrations due to the projection optical system PL adjusted is measured likewise. Until the answer in the step 102 becomes YES, the adjustment of the projection optical system PL in terms of the wave-front-aberration (step 103) and the measurement of the wave-front-aberration (step 101) are repeated. And when the answer in the step 102 becomes YES, the process proceeds to a step 104.

In the step 104, after the wave front sensor 90 has been removed from the wafer stage WST, and the wave-front-data processing unit 80 is disconnected from the main control system 20, a reticle loader (not shown) loads a reticle R having a given pattern formed thereon onto the reticle stage RST under the control of the main control system 20, and a wafer loader (not shown) loads a wafer W subject to exposure onto the wafer stage WST.

Next, in a step 105, measurement for exposure is performed under the control of the main control system 20, such as reticle alignment using a reference mark plate (not shown) on the wafer stage WST and measurement of baseline amount using the alignment detection system AS. When the exposure of the wafer W is for a second or later layer, the arrangement coordinates of shot areas on the wafer W are detected very accurately by the above EGA measurement using the alignment detection system AS so that the layer pattern to be formed can be very accurately aligned with previous layers' pattern already formed thereon.

Next, in a step 106, before exposure the wafer stage WST is moved so that a first shot area on the wafer W is positioned at a scan start position for exposure. The main control system 20 controls such movement via the stage control system 19 and the wafer-stage driving portion 24 based on position information (or speed information) of the wafer stage WST from the wafer interferometer 18 and, if the second or later layer, the detection result of the positional relation between a reference coordinate system and the arrangement coordinate system as well. At the same time the reticle stage RST is moved so that the reticle R is positioned at a scan start position for reticles, via the stage control system 19 and a reticle-stage driving portion (not shown) by the main control system 20.

Next, the stage control system 19, according to instructions from the main control system 20, performs scan exposure while adjusting the position of the wafer W surface based on the Z-direction position information of the wafer W from the multi-focus-position detection system (21, 22), the X-Y position information of the reticle R from the reticle interferometer 16 and the X-Y position information of the wafer W from the wafer interferometer 18 and moving relatively the reticle R and wafer W via the reticle-stage driving portion (not shown) and via the wafer-stage driving portion 24.

After the completion of exposure of the first shot area, the wafer stage WST is moved so that a next shot area is positioned at the scan start position for exposure, and at the same time the reticle stage RST is moved so that the reticle R is positioned at the scan start position for reticles. The scan exposure of the shot area is performed in the same way as the first shot area. After that, the scan exposure is repeated until the shot areas have been exposed.

In a step 107 an unloader (not shown) unloads the exposed wafer W from the wafer holder 25, by which the exposure of the wafer W is completed.

In the exposure of later wafers, the wafer exposure sequence of the steps 104 through 107 is performed with, if necessary, measuring and adjusting wave-front aberration due to the projection optical system PL (steps 101 through 103).

As described above, according to this embodiment, after template matching which calculates correlation-values between a pick-up result with accuracy of about $\frac{1}{10}$ of the picture element's dimension in detecting spot-image positions and 100 (=10×10) templates, a curved surface function is obtained that fits the distribution of correlation-values in positions near the position of the maximum template whose correlation-value is maximal, and a position is obtained as the spot-image position, where the optimum fitting function takes on a local maximum in or near the maximum template position. As a result, the positions of spot-images can be detected with improved accuracy in comparison to the accuracy of about $\frac{1}{10}$ of the picture element's dimension in the template matching. That is, by using a technique such as template matching or function fitting that is robust to noise, the spot-image positions can be accurately detected while reducing the number of times of calculating correlation-values in the template matching and the number of templates prepared beforehand. Therefore, using the simple construction the spot-image positions can be quickly and accurately detected.

Moreover, the wave-front aberration due to the projection optical system PL can be accurately calculated based on the real spot-image positions accurately detected.

Furthermore, because the projection optical system PL is adjusted in terms of the wave-front aberration based on the accurately calculated wave-front aberration due to the projection optical system PL, and the given pattern of the reticle R is projected onto a wafer W through the projection optical system PL that causes little aberration, the given pattern can be very accurately transferred on the wafer W.

It is noted that while in the above embodiment the plurality of templates correspond to spot images given by displacing the position of an ideal spot image by distances of $\frac{1}{10}$ of the picture element's dimension, not being limited to this, the distance may be, for example, $\frac{1}{20}$ or $\frac{1}{5}$ of the picture element's dimension.

Furthermore, while the curved surface function for fitting is a second-order function given by the expression (1), the curved surface function may be another function that is of a second order or over. For example, CF' (X,Y) given by the following expression (4) may be used $$CF'(X,Y)=a_0+a_1 \cdot X+a_2 \cdot Y+a_3 \cdot X^2+a_4 \cdot X \cdot Y+a_5 \cdot Y^2+a_6 \cdot X \cdot (X^2+Y^2)+ a_7 \cdot Y \cdot (X^2+Y^2)+a_8 \cdot (X^2+Y^2)^2. \qquad (4)$$

Here, because the number of the unknown values $a_0$ through $a_8$ is nine, the unknown values $a_0$ through $a_8$ can be determined in fitting to the distribution of nine correlation values.

While in the above embodiment the number of correlation values in fitting a curved surface function is nine, the number may be, for example, 16 (4×4) or 25 (5×5).

Moreover, in fitting a curved surface function, weighing according to accuracy in measuring a spot image which varies with S/N ratio or the like thereof is effective to improve the position detection accuracy.

Yet further, while in fitting a curved surface function in the above embodiment, a two-dimensional position of a spot image is calculated at one time, a position of a spot image in each of two one-dimensional directions that are not parallel to each other may be obtained by fitting a curved line function to the distribution of correlation values in the one-dimensional direction in order to obtain the two-dimensional position.

Taking correlation values, for example, $CF[m_0-1,n_0]$, $CF[m_0,n_0]$, and $CF[m_0+1,n_0]$ as objects, the following curved line function CFX(X) is fitted to them $$CFX(X)=a_0+a_1 \cdot X+a_2 \cdot X^2. \qquad (5)$$

Here, because the number of the unknown values $a_0$ through $a_2$ is three, the unknown values $a_0$ through $a_2$ can be determined in fitting to the distribution of the three correlation values.

Subsequently, an X-position is obtained as the X-position of the spot image, where the curved line function CFX(X) having the calculated coefficients takes on a locally maximum value by using the following equation (6)

$$d[CFX(X)]/dX=0. \qquad (6)$$

Then taking the correlation values $CF[m_0,n_0-1]$, $CF[m_0, n_0]$, and $CF[m_0,n_0+1]$ as objects, the following curved line function CFY(Y) is fitted to them $$CFY(Y)=b_0+b_1 \cdot Y+b_2 \cdot Y^2. \qquad (7)$$

Here, because the number of the unknown values $b_0$ through $b_2$ is three as in the case of the function (5), the unknown values $b_0$ through $b_2$ can be determined in fitting to the distribution of the three correlation values.

Subsequently, a Y-position is obtained as the Y-position of the spot image, where the curved line function CFY(Y) having the calculated coefficients takes on a locally maximum value by using the following equation (8)

$$d[CFY(Y)]/dY=0. \qquad (8)$$

The X- and Y-position of the spot image are separately calculated in that way to obtain the two-dimensional position of the spot image.

By separately calculating the X- and Y-positions of a spot image the amount of calculation can be reduced compared with calculating the two-dimensional position of the spot image at one time.

Although, in the above fitting of a curved surface function, the number of correlation values as objects in the fitting is three, the number may be more than three, in which case, because the number of the correlation values is larger than the unknown values, the unknown values need to be determined by the least-squares method.

Furthermore, while the curved line functions for fitting are second-order functions given by the expressions (5) and (7), the curved line function may be another function that is of a second order or over.

While in the above embodiment the number of the pinhole-like features of the measurement reticle RT is nine, more or less than nine pinhole-like features may be provided depending on the desired accuracy in measurement of wave-front aberration. Also, the number and arrangement of micro lenses 94a in the micro-lens array 94 can be changed depending on the desired accuracy in measurement of wave-front aberration.

In addition, although in the above embodiment the spot-image is used in detecting the position, an image having another shape may be used.

Furthermore, although in the above embodiment the wave-front-aberration measuring unit 70 is removed from the exposure-apparatus main body 60 before exposure, needless to say, exposure may be performed without removing the wave-front-aberration measuring unit 70.

In addition, in the above embodiment a second CCD for measuring the shape of the pupil of an optical system to be examined may be provided. For example, in FIG. 2 the second CCD may be arranged behind a half mirror in place of the reflection mirror 96b and at a position optically conjugate to the pupil of the optical system to be examined. The center of the CCD 95 can be made to coincide with the center of the projection optical system's pupil by using the second CCD, so that the position deviations of spot images from the center of the pupil can be measured.

In addition, while the above embodiment describes the case where the scan-type exposure apparatus is employed, this invention can be applied to any exposure apparatus having a projection optical system regardless of whether it is of a step-and-repeat type, a step-and-scan type, or a step-and-stitching type.

Yet further, while in the above embodiment this invention is applied to aberration measurement of the projection optical system of an exposure apparatus, not being limited to an exposure apparatus, this invention can be applied to aberration measurement of imaging optical systems of other kinds of apparatuses.

Yet further, this invention can also be applied to, for example, measurement of an optical characteristic of a reflection mirror and the like.

<<Manufacture of Devices>>

Next, the manufacture of devices by using the above exposure apparatus and method will be described.

Figure 12:
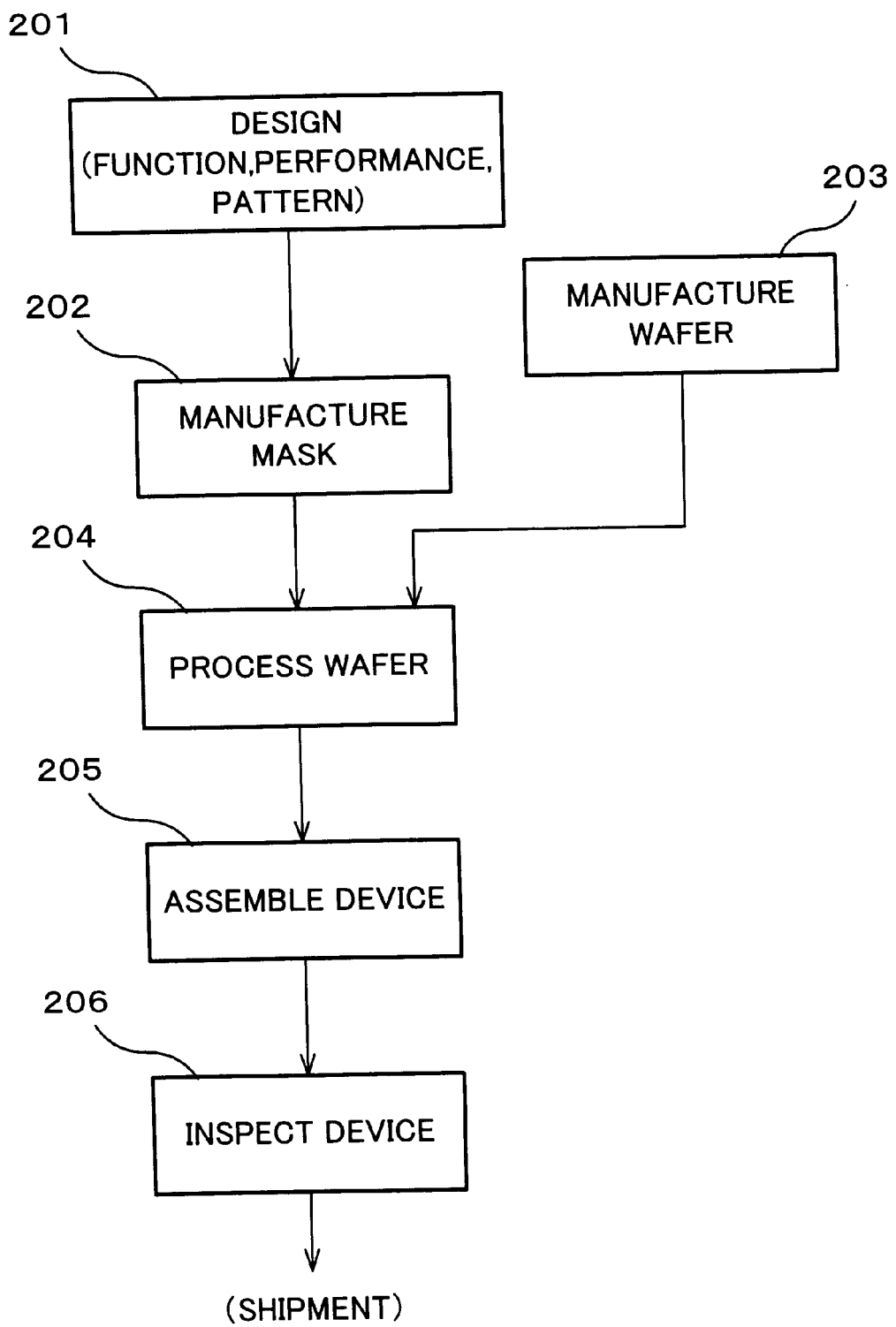
FIG. 12 is a flow chart for explaining the method of manufacturing devices using the exposure apparatus shown in FIG. 1.

FIG. 12 is a flow chart for the manufacture of devices (semiconductor chips such as IC or LSI, liquid crystal panels, CCD's, thin magnetic heads, micro machines, or the like) in this embodiment. As shown in FIG. 12, in step 201 (design step), function/performance design for the devices (e.g., circuit design for semiconductor devices) is performed and pattern design is performed to implement the function. In step 202 (mask manufacturing step), masks on which a different sub-pattern of the designed circuit is formed are produced. In step 203 (wafer manufacturing step), wafers are manufactured by using silicon material or the like.

In step 204 (wafer processing step), actual circuits and the like are formed on the wafers by lithography or the like using the masks and the wafers prepared in steps 201 through 203, as will be described later. In step 205 (device assembly step), the devices are assembled from the wafers processed in step 204. Step 205 includes processes such as dicing, bonding, and packaging (chip encapsulation).

Finally, in step 206 (inspection step), a test on the operation of each of the devices, durability test, and the like are performed. After these steps, the process ends and the devices are shipped out.

Figure 13:
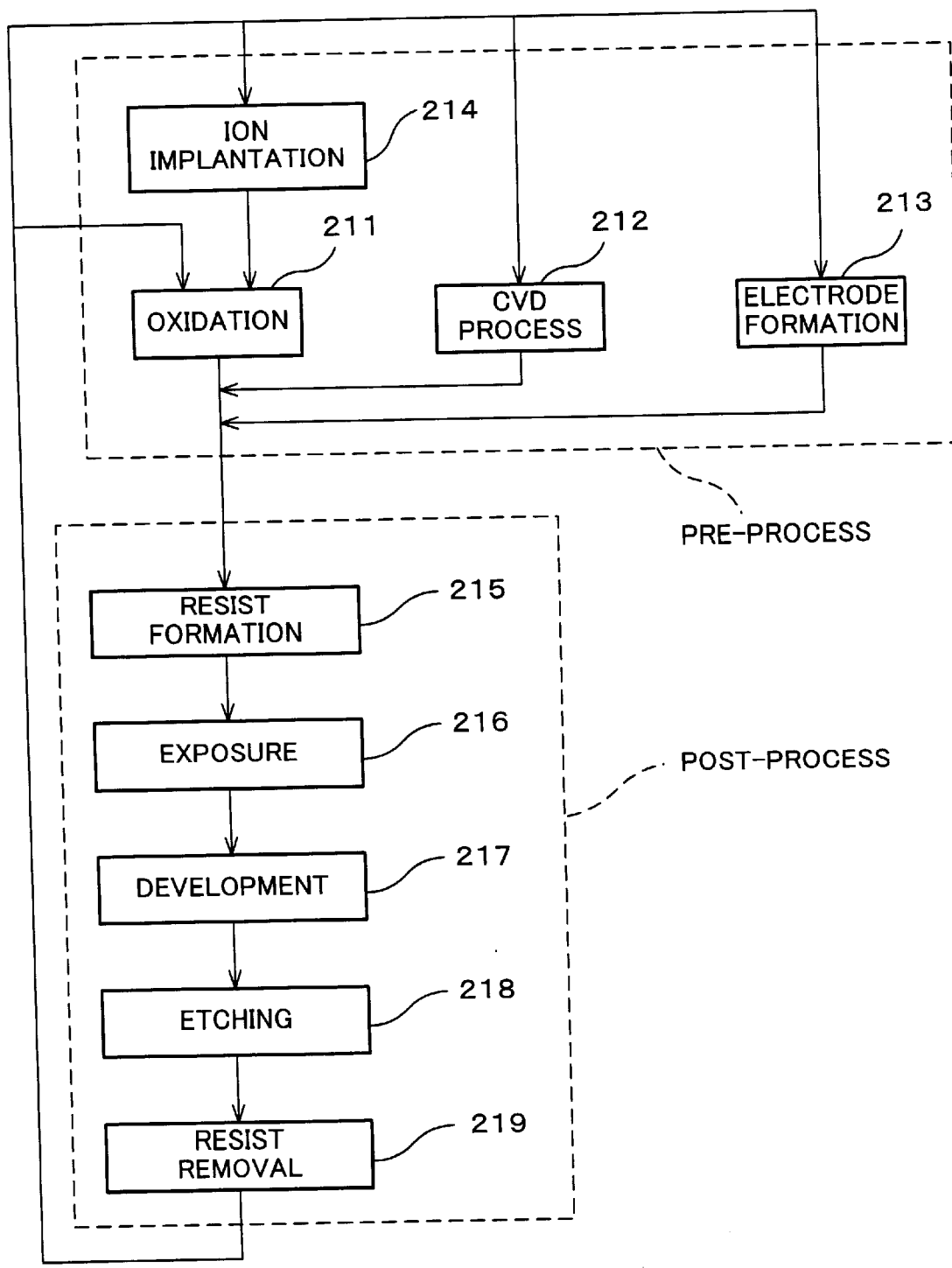
FIG. 13 is a flow chart showing the process in the wafer process step of FIG. 12.

FIG. 13 is a flow chart showing a detailed example of step 204 described above in manufacturing semiconductor devices. Referring to FIG. 13, in step 211 (oxidation step), the surface of a wafer is oxidized. In step 212 (CVD step), an insulating film is formed on the wafer surface. In step 213 (electrode formation step), electrodes are formed on the wafer by vapor deposition. In step 214 (ion implantation step), ions are implanted into the wafer. Steps 211 through 214 described above constitute a pre-process for each step in the wafer process and are selectively executed in accordance with the processing required in each step.

When the above pre-process is completed in each step in the wafer process, a post-process is executed as follows. In this post-process, first of all, in step 215 (resist formation step), the wafer is coated with a photosensitive material (resist). In step 216, the above exposure apparatus transfers a sub-pattern of the circuit on a mask onto the wafer according to the above method. In step 217 (development step), the exposed wafer is developed. In step 218 (etching step), an exposing member on portions other than portions on which the resist is left is removed by etching. In step 219 (resist removing step), the unnecessary resist after the etching is removed.

By repeatedly performing these pre-process and post-process, a multiple-layer circuit pattern is formed on each shot-area of the wafer.

In the above manner, the devices on which a fine pattern is accurately formed are manufactured.

Although the embodiments according to the present invention are preferred embodiments, those skilled in the art of lithography systems can readily think of numerous additions, modifications and substitutions to the above embodiments, without departing from the scope and spirit of this invention. It is contemplated that any such additions, modifications and substitutions will fall within the scope of the present invention, which is defined by the claims appended hereto.

What is claimed is:

1. A position detecting method with which to detect a position of a picked-up image, the position detecting method comprising:
    preparing a plurality of templates with which correlation values of a picture-element data distribution, as a pick-up result of the image, are calculated and which correspond to reference images of which center positions are spaced a predetermined distance apart;
    obtaining, by calculating correlation values between the picture-element data distribution and the plurality of templates, position of a maximum template whose correlation value is maximal;
    obtaining at least one of a curved line function and curved surface function which fit a distribution of correlation values of the correlation values calculated, the center of the distribution being present in the maximum template's position; and
    calculating position of the picked-up image based on the at least one function.

2. A position detecting method according to claim 1, wherein the picked-up image is a spot image.

3. A position detecting method according to claim 1, wherein a first number denoting the number of the correlation values to which the at least one function is fitted is larger than a second number denoting the number of parameters which define the at least one function, and wherein in the obtaining of the at least one function the second number of parameters are determined using a statistical method.

4. A position detecting unit which detects a position of a picked-up image by a pick-up unit, the position detecting unit comprising:
    a template-preparing unit connected to the pick-up unit, which prepares a plurality of templates with which correlation values of a picture-element data distribution, as a pick-up result of the image, are calculated and which correspond to reference images of which center positions are spaced a predetermined distance apart;
    a correlation-computing unit connected to the template-preparing unit, which, by calculating correlation values between the picture-element data distribution and the plurality of templates, obtains position of a maximum template whose correlation value is maximal; and
    an image-position calculating unit connected to the correlation-computing unit, which obtains at least one of a curved line function and curved surface function which fit a distribution of correlation values of the correlation values calculated and each are a function of position, the center of the distribution being present in the maximum template's position, and calculates position of the picked-up image based on the at least one function.

5. A position detecting unit according to claim 4, wherein the picked-up image is a spot image.

6. An optical characteristic measuring method with which to measure an optical characteristic of an optical system to be examined, the optical characteristic measuring method comprising:
    dividing a wave front of light which has passed through the optical system to be examined, to form a plurality of images;
    picking up the plurality of images;
    detecting positions of the plurality of images picked up in the picking-up using the position detecting method according to claim 1; and
    calculating an optical characteristic of the optical system to be examined based on the detected positions of the images.

7. An optical characteristic measuring method according to claim 6, wherein the optical characteristic is wave-front aberration.

8. An optical characteristic measuring unit which measures an optical characteristic of an optical system to be examined, the optical characteristic measuring unit comprising:
    a wave-front dividing device which is arranged on an optical path of light passing through the optical system to be examined, divides a wave front of the light passing through the optical system to be examined, and forms a plurality of images;
    a pick-up unit which is arranged a predetermined distance apart from the wave-front dividing device and picks up the plurality of images;
    a position detecting unit according to claim 4, which is connected to the pick-up unit and detects positions of the plurality of images picked up by the pick-up unit; and
    an optical characteristic calculating unit connected to the position detecting unit, which calculates an optical characteristic of the optical system to be examined based on the detected positions of the plurality of images.

9. An optical characteristic measuring unit according to claim 8, wherein the wave-front dividing device is a microlens array in which lens elements are arranged two-dimensionally.

10. An optical characteristic measuring unit according to claim 8, wherein the optical system to be examined is a projection optical system that transfers a pattern formed on a mask onto a substrate.

11. An exposure apparatus which, by illuminating a substrate with exposure light, transfers a predetermined pattern onto a substrate, comprising:
    an exposure apparatus main body which comprises a projection optical system arranged on an optical path of the exposure light; and
    an optical characteristic measuring unit according to claim 8 with the projection optical system as the optical system to be examined.

12. An exposure apparatus according to claim 11, wherein the optical characteristic measuring unit is attachable to and detachable from the exposure apparatus main body.

13. A device manufacturing method including a lithography process, wherein in the lithography process, an exposure apparatus according to claim 11 performs exposure.

* * * * *